United States Patent [19]

Yamamoto et al.

[11] Patent Number: 4,677,633
[45] Date of Patent: Jun. 30, 1987

[54] SEMICONDUCTOR LASER WITH A TWO-STRIPED CHANNEL

[75] Inventors: Saburo Yamamoto, Nara; Hiroshi Hayashi, Kyoto; Taiji Morimoto; Seiki Yano, both of Nara, all of Japan

[73] Assignee: Sharp Kabushiki Kaisha, Osaka, Japan

[21] Appl. No.: 723,390

[22] Filed: Apr. 15, 1985

[30] Foreign Application Priority Data

| Apr. 17, 1984 | [JP] | Japan | 59-79056 |
| Apr. 20, 1984 | [JP] | Japan | 59-80904 |
| May 18, 1984 | [JP] | Japan | 59-101354 |

[51] Int. Cl.$^4$ ............................................. H01S 3/19
[52] U.S. Cl. ......................................... 372/45; 372/46; 372/48
[58] Field of Search ................. 372/48, 46, 44, 45; 357/17

[56] References Cited

U.S. PATENT DOCUMENTS 4,545,057 10/1985 Hayakawa et al. .................. 372/46

FOREIGN PATENT DOCUMENTS 0138977 10/1981 Japan ................................... 372/45
0207691 12/1983 Japan .
0119883  7/1984 Japan ................................... 372/45

OTHER PUBLICATIONS

H. Yonezu, et al., Applied Physics Letters, pp. 637–639, May 15th, 1979.
TGED, 81-42, 31 (Jul. 1981), IECE Japan.

Primary Examiner—James W. Davie
Attorney, Agent, or Firm—Spencer & Frank

[57] ABSTRACT

A semiconductor laser comprising a substrate having a two step-striped channel; and a double heterostructure-laser-operating area having successively a cladding layer, an active layer and a second cladding layer on the substrate. The two step-striped channels are composed of a first channel and a second channel having a width which is narrower than the width of the first channel and having a depth which is deeper than the depth of the first channel. The second channel is positioned in the center portion of the first channel, thereby allowing current injected into the active layer to flow into the center portion of the two step-striped channel.

12 Claims, 14 Drawing Figures

Note: $\bar{n}_{1.3}$ indicates the complex refraction index of each of the cladding layers 3 and 5 in FIG. 3. $\bar{n}_2$ indicates the complex refraction index of the active layer 4 in FIG. 3.

Note: $\bar{n}_{1,3}$ indicates the complex refraction index of each of the cladding layers 3 and 5 in FIG. 3. $\bar{n}_2$ indicates the complex refraction index of the active layer 4 in FIG. 3.

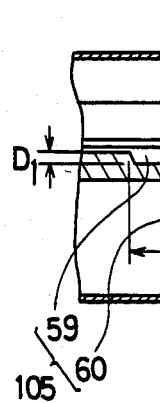
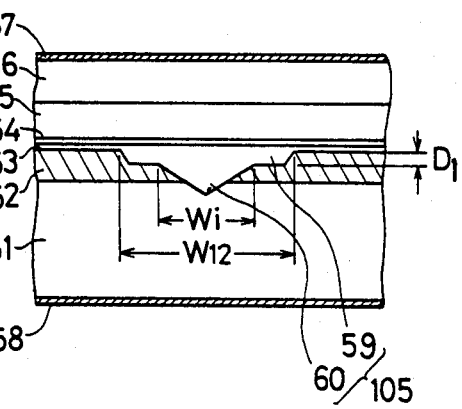
FIG.12(a)  FIG.12(b)
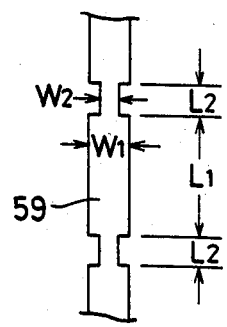
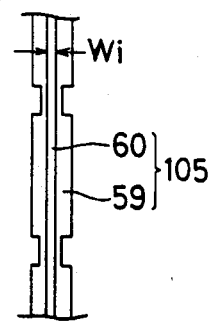
FIG.13(a)  FIG.13(b)

SEMICONDUCTOR LASER WITH A TWO-STRIPED CHANNEL

BACKGROUND OF THE INVENTION

1. Field of the Invention

This invention relates to a novel semiconductor laser which is effective to control the transverse mode of laser oscillation.

2. Description of the Prior Art

Conventional semiconductor lasers are classified into two groups based on the structure of the active layer. One class consists of semiconductors lasers with a plane active layer and the of semiconductor lasers with a crescent active layer.

Semiconductor lasers with a plane active layer are inferior in that the oscillation threshold current is at a high level and the differential quantum efficiency is low, although they are excellent in that they attain laser oscillation in a fundamental transverse mode. On the contrary, semiconductor lasers with a cresent active layer are inferior in that they tend to produce laser oscillation in a high-order transverse mode, although they are excellent in that the oscillation threshold current is at an extremely low level and the differential quantum efficiency is high.

FIG. 1(a) shows a VSIS (V-shaped channel substrate inner stripe) semiconductor laser with a plane active layer, as an example of the above-mentioned semiconductor laser with a plane active layer, which comprises a p-GaAs substrate 111, an n-GaAs current blocking layer 112, a p-GaAlAs cladding layer 113, an n-GaAlAs plane active layer 114, an n-GaAlAs cladding layer 115, an n-GaAs cap layer 116, a top electrode 117 and a bottom electrode 118. The VSIS laser with a plane active layer, which is disclosed in TGED 81-42, 31 (1981-July) IECE Japan, attains laser oscillation in a stable fundamental transverse mode up to an optical output power of 20 mW, but the oscillation threshold current level is as high as 40–60 mA and the differential quantum efficiency is as low as 15%.

FIG. 1(b) shows a VSIS semiconductor laser with a crescent active layer, as an example of the above-mentioned semiconductor laser with a crescent active layer, which comprises a p-GaAs substrate 111, an n-GaAs current blocking layer 112, a p-GaAlAs cladding layer 113, an n-GaAlAs crescent active layer 214, an n-GaAlAs cladding layer 115, an n-GaAs cap layer 116, a top electrode 117 and a bottom electrode 118. The VSIS laser with a crescent active layer, which is also disclosed in TGED 81-41, 31 (1981-July) IECE Japan, although the oscillation threshold current level is as low as 20 mA and the differential quantum efficiency is as high as 25%, tends to produce laser oscillation in a high-order transverse mode even at a low output power (e.g., 1-3 mV), because the prevention of light from transversely expanding is dependent upon the difference $\Delta N$ in the effective refraction index which is based on the difference $\Delta d$ in the layer thickness resulting from the concaved shape of the active layer. The difference $\Delta N$ is $1\times 10^{-2}$ or more which is exceedingly great. Therefore, if the difference $\Delta d$ in the thickness of the crescent active layer is small and the difference $\Delta N$ in the effective refraction is as small as around $2\times 10^{-3}$, laser oscillation in a fundamental transverse mode will be attained.

On the other hand, in the VSIS semiconductor laser with a plane active layer shown in FIG. 1(a), light goes through a waveguide depending upon both the difference $\Delta N$ in the effective refraction index and the difference $\Delta \alpha$ in the loss of the active layer 114 between the inside and the outside of the V-shaped channel 119, so that even though the difference $\Delta N$ is maintained at a high level, light in a high-order transverse mode in the outside region of the V-shaped channel 119 is absorbed by the current blocking layer 112 thereby maintaining a fundamental transverse mode up to a high output power. However, as the difference $\Delta N$ becomes great, the difference $\Delta \alpha$ becomes great, e.g. 1000–2000 cm$^{-1}$. When the difference $\Delta \alpha$ is great, the light phase is delayed so that the beam waist tends to be positioned in the inside of the facets of the laser. Thus, conventional VSIS lasers have the drawbacks that beam waists in the direction parallel to the junction are at position of from 5 to 15 $\mu$m from the facet, resulting in an astigmatism.

A window stripe semiconductor laser was proposed in Appl. Phys. Lett. May 15, 1979 P. 637, wherein the absorption of laser light around the facet is reduced to attain laser oscillation at a high output level without deterioration and/or damage to the facet. Japanese Patent Application No. 57-91636 proposes another window stripe semiconductor laser as shown in FIGS. 2(a) and 2(b), wherein an optical waveguide is formed in the window region of the above-mentioned window laser in Appl. Phys. Lett. to control both the beam waist and the high-order transverse mode thereby attaining laser oscillation in a fundamental transverse mode alone. This window laser comprises an n-GaAs current blocking layer 312 which cuts off current on a p-GaAs substrate 311. In the current blocking layer 312 and the GaAs substrate 311, a striped channel 319 having the width of $Wc_1$ and a striped channel 419 having the width of $Wc_2 (Wc_1 > Wc_2)$ are continuously formed. A p-GaAlAs cladding layer 313, a GaAs or a GaAlAs active layer 314, an n-GaAlAs cladding layer 315 and an n-GaAs cap layer 316 are successively disposed thereon. Electrodes 317 and 318 are disposed on the cap layer 316 and the GaAs substrate 311, respectively. The portion of the active layer 314 corresponding to the channel 319 has a concaved shape to form an optical waveguide having a width which is narrower than the width $Wc_1$ of the channel 319. The portion of the active layer 314 corresponding to the channel 419 is plane shape to form an optical waveguide having substantially the same width as the width $Wc_2$ of the channel 419, based on the fact that the effective refraction index becomes small due to light absorption by the n-GaAs current blocking layer 312 on both sides of the channel 419.

FIG. 2(a) shows the center portion of the window laser which is corresponds to a VSIS semiconductor laser with a crescent active layer shown in FIG. 1(b). FIG. 2(b) shows the vicinity of the facet of the window laser which is correspondent to a VSIS semiconductor laser with a plane active layer shown in FIG. 1(a).

It has been found that the above-mentioned window VSIS semiconductor laser cannot be mass produced since lasers maintaining a fundamental transverse mode up to an optical output power of 20 mW or more at one of the facets thereof can only be obtained with a low yield. This is because of the difficulty of controling the curvature of the active layer 314 in the inside region of the laser. When the active layer is exceedingly concave, laser oscillation in a high-order transverse mode tends to be produced and even though the plane window region of the active layer 314 is prolonged in the facets of the laser, sufficient laser oscillation in a fundamental transverse mode cannot be attained. Moreover, the width Wc₂ of the channel 419 of the window VSIS semiconductor laser is extremely narrow (e.g., approximately 4 μm) and the thickness of the p-cladding layer 313 is then (e.g., approximately 0.1 μm) so that light absorption by the current blocking layer 312 on both sides of the channel 419 is increased, resulting in astigmatism and/or a decrease in the differential quantum efficiency.

SUMMARY OF THE INVENTION

The semiconductor laser of this invention which overcomes the above-discussed disadvantages and numerous other drawbacks and deficiencies of the prior art, comprises a substrate having a two step-striped channel; and a double heterostructure-laser-operating area having successively a cladding layer, an active layer and a second cladding layer on the substrate, the two step-striped channel being composed of a first channel and a second channel having a width which is narrower than that of the first channel and having a depth which is deeper than that of the first channel and the second channel being positioned in the center portion of the first channel, thereby allowing a current injected into the active layer to flow into the center portion of the two step-striped channel.

The active layer is a crescent active layer having a downward curvature corresponding to the center portion of the two step-striped channel.

The difference $\Delta \bar{n}$ in complex refraction index between the inside and the outside of the second channel is $4 \times 10^{-3}$ or more with regard to the real number portion $Re(\Delta \bar{n})$ thereof and $4 \times 10^{-3}$ or less with regard to the imaginary number portion $Im(\Delta \bar{n})$ thereof, and the ratio of $Re(\Delta \bar{n})$ to $Im(\Delta \bar{n})$ is 1.5 or more.

The first channel has a selected width to form window regions in the vicinity of the facets of the laser, the active layer is a plane-shape in each of the window regions in the vicinity of the facets of the laser and a crescent-shape in the other region in the inside of the laser, resulting in a window stripe semiconductor laser.

Thus, the invention described herein makes possible the objects of (1) providing a semiconductor laser which attains laser oscillation in a stabilized fundamental transverse mode up to a high optical output power; (2) providing a semiconductor laser wherein beam waists are at the position in the facets thereof, namely astigmatism is not observed; (3) providing a semiconductor laser with a crescent active layer which attains laser oscillation in a fundamental transverse mode up to a high optical output power; (4) providing a window stripe semiconductor laser which attains laser oscillation in a stabilized fundamental transverse mode up to a high optical output power; and (5) providing a window stripe semiconductor laser wherein the differential quantum efficiency is high and astigmatism is not observed.

BRIEF DESCRIPTION OF THE DRAWINGS

This invention may be better understood and its numerous objects and advantages will become apparent to those skilled in the art by reference to the accompanying drawings as follows:

FIGS. 12(a) and (b) are front sectional views of the inside region and the window region of a window BSIS semiconductor laser of this invention, respectively.

FIGS. 13(a) and (b), respectively, are diagrammatical plane views of a production process of the window BSIS semiconductor laser shown in FIGS. 12(a) and (b).

DESCRIPTION OF THE PREFERRED EMBODIMENTS

Figure 1A:
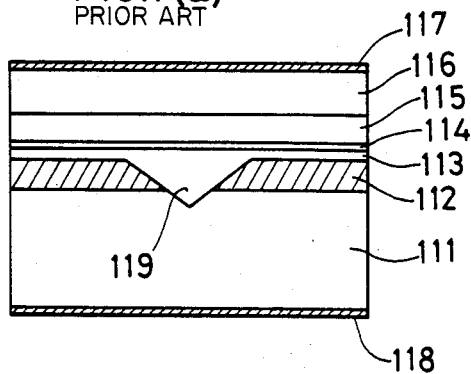
FIG. 1(a) is a front sectional view of a conventional VSIS semiconductor laser with a plane active layer.
Figure 1B:
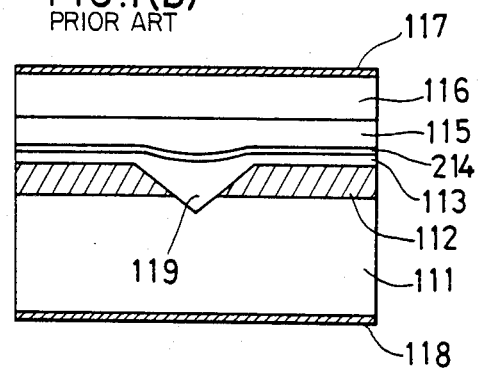
FIG. 1(b) is a front sectional view of a conventional VSIS semiconductor laser with a crescent active layer.
Figure 2A:
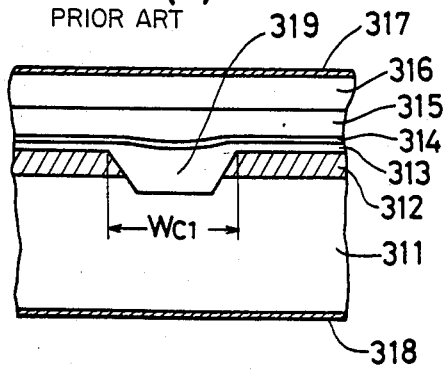
FIG. 2(a) is a front sectional view of the center portion of a conventional window VSIS semiconductor laser.
Figure 2B:
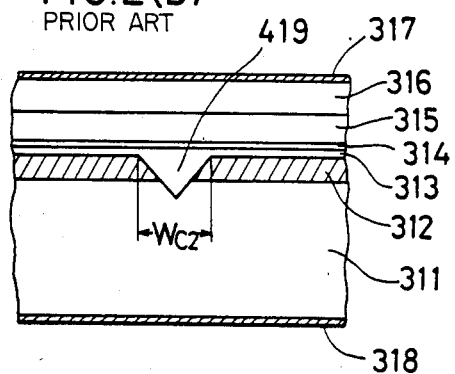
FIG. 2(b) is a front sectional view of the vicinity of the facet of a conventional window VSIS semiconductor laser.
Figure 3:
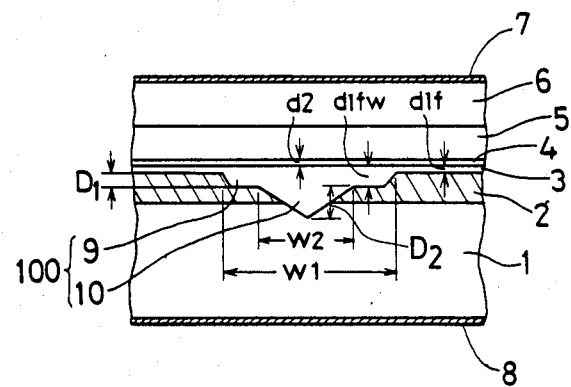
FIG. 3 is a front sectional view of a BSIS semiconductor laser of this invention.

FIG. 3 shows a BSIS (broad-channelled substrate inner stripe) semiconductor laser of this invention, which is produced as follows:

On a p-GaAs substrate 1, an n-GaAs current blocking layer 2 is formed to cut off a current to the p-GaAs substrate 1. The current blocking layer 2 is etched by a well known etching technique, resulting in a channel 9 having the width $W_1$ and the depth $D_1$. Then, by an etching technique, a V-shaped channel 10 having the width $W_2$ ($W_1 > W_2$) and the depth $D_2$ ($D_1 < D_2$) is formed in the center portion of the channel 9, resulting in a two step-striped channel 100 on the substrate 1. On the substrate 1, a double heterostructure laser-operating area is formed which successively comprises a p-GaAlAs cladding layer 3, a pGaAlAs active layer 4, an n-GaAlAs cladding layer 5 and an n-GaAs cap layer 6. The inventors studied how the difference $\Delta \bar{n}$ in the complex refraction index between the inside and the outside of the second V-shaped channel 10 depends upon the thickness $d_2$ of the active layer 4 and the thickness $d_{1fw}$ of the p-cladding layer 3 within the first channel 9. Each of the real number portions $Re(\Delta\bar{n})$ and the imaginary number portion $Im(\Delta\bar{n})$ of the difference $\Delta\bar{n}$ of the complex refraction index is represented by the formula:

$$Re(\Delta\bar{n}) = \Delta N \qquad (1)$$

$$Im(\Delta\bar{n}) = \Delta\alpha/2k \qquad (2)$$

wherein $\Delta N$ is the difference in the effective refraction index, $\Delta\alpha$ is the difference in the loss of current in the outside of the V-shaped channel 10, and k is the number $(2\pi/\lambda)$ of waves.

Figure 4:
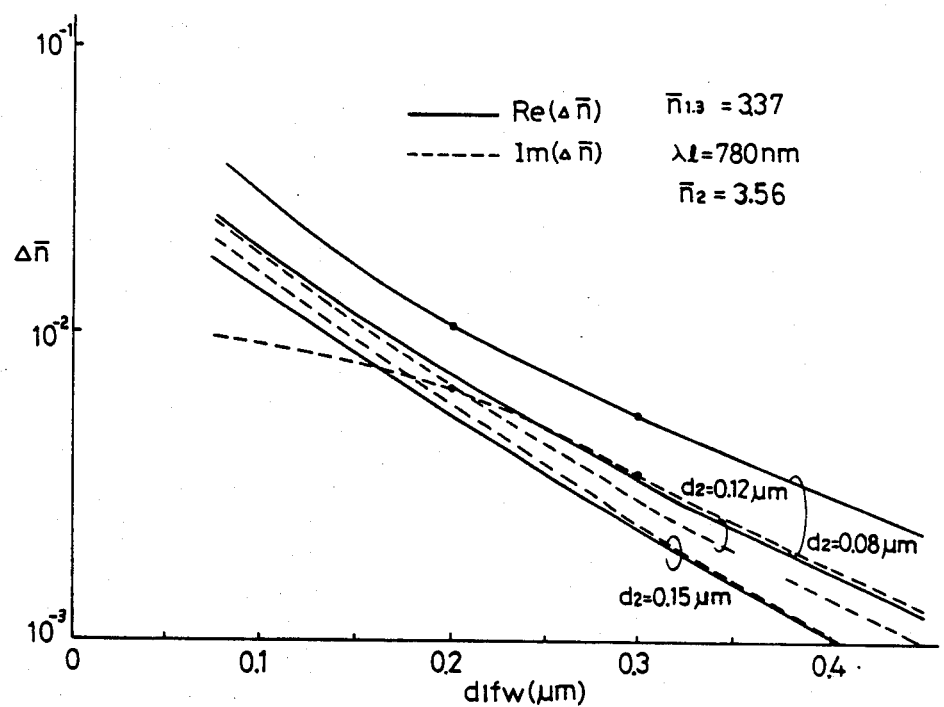
FIG. 4 is a graph showing the relationship between the thickness $d_{1fw}$ of a p-cladding layer within the first channel 9 and the difference $\Delta \bar{n}$ in the complex refraction index with regard to the semiconductor laser shown in FIG. 3.

The results are shown in FIG. 4 (with regard to the wavelength $\lambda$ of 780 nm) indicating that $Re(\Delta\bar{n})$ and $Im(\Delta\bar{n})$ (i.e., $\Delta N$ and $\Delta\alpha$) are reduced with an increase in $d_{1fw}$ and $d_2$. In addition to the above-discussed differences of $\Delta N$ and $\Delta\alpha$, the difference in the refraction index due to a carrier injected into the active layer 4 is explained as follows:

When the optical output power is increased, variation of the carrier distribution arises due to spacial hole burning and variation of the distribution of the refraction index arises, resulting in turbulence of the transverse mode, the extent of variation of which is around $3 \times 10^{-3}$. Thus, in order to produce a stabilized transverse mode, it is required to sufficiently increase the difference $\Delta N$ in the built-in effective refraction index thereby avoiding an influence on the variation of the carrier distribution. Since the conventional VSIS laser has an active layer with a thickness $d_2$ of 0.1 $\mu$m and a cladding layer with a thickness $d_{1f}$ of 0.15 $\mu$m, the carrier absorption $\Delta\alpha$ outside of the V-shaped channel is 2000 cm$^{-1}$ which is exceedingly great, while $\Delta N$ is sufficient at $1.5 \times 10^{-2}$. When $\Delta\alpha$ is exceedingly great, the optical phase is delayed therein so that its beam waist tends to be positioned in the inside of the facet. Moreover, the differential quantum efficiency becomes 15% or less.

For the above-discussed reasons, an active layer having the thickness $d_2$ and a cladding layer having the thickness $d_{1fw}$ should be constructed such that $\Delta N$ is as great as possible and $\Delta\alpha$ is as small as possible. The inventors studied how the ratio R of $Re(\Delta\bar{n})$ to $Im(\Delta\bar{n})$ depnds upon $d_2$ and $d_{1fw}$ and devised the following formula:

$$R = Re(\Delta\bar{n})/Im(\Delta\bar{n}) \qquad (3)$$

Figure 5:
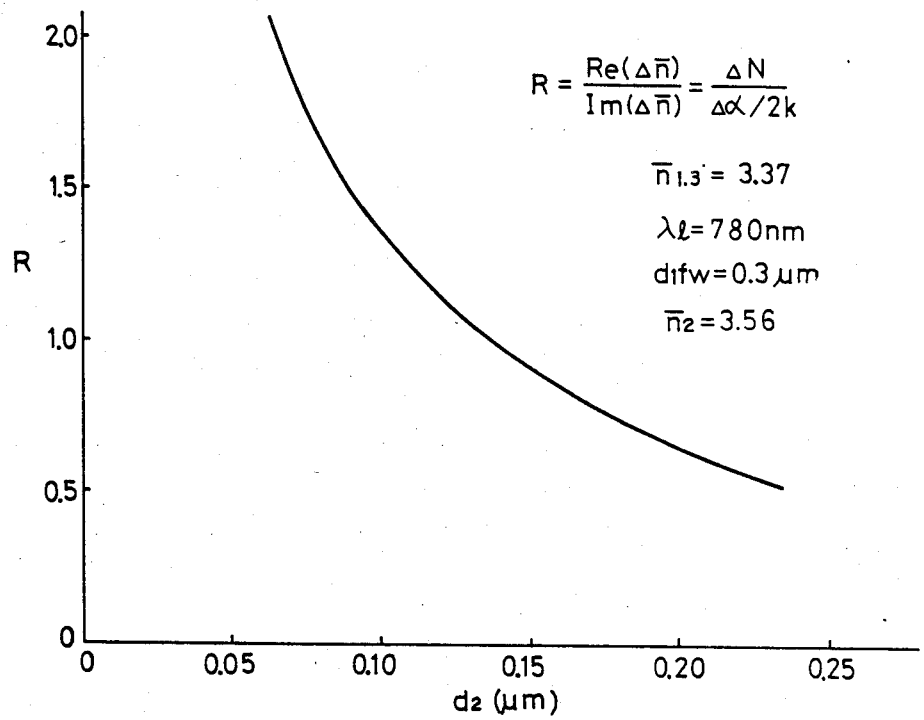
FIG. 5 is a graph showing the relationship between the thickness $d_2$ of the active layer and the parameter R with regard to the semiconductor laser shown in FIG. 3.
Figure 6:
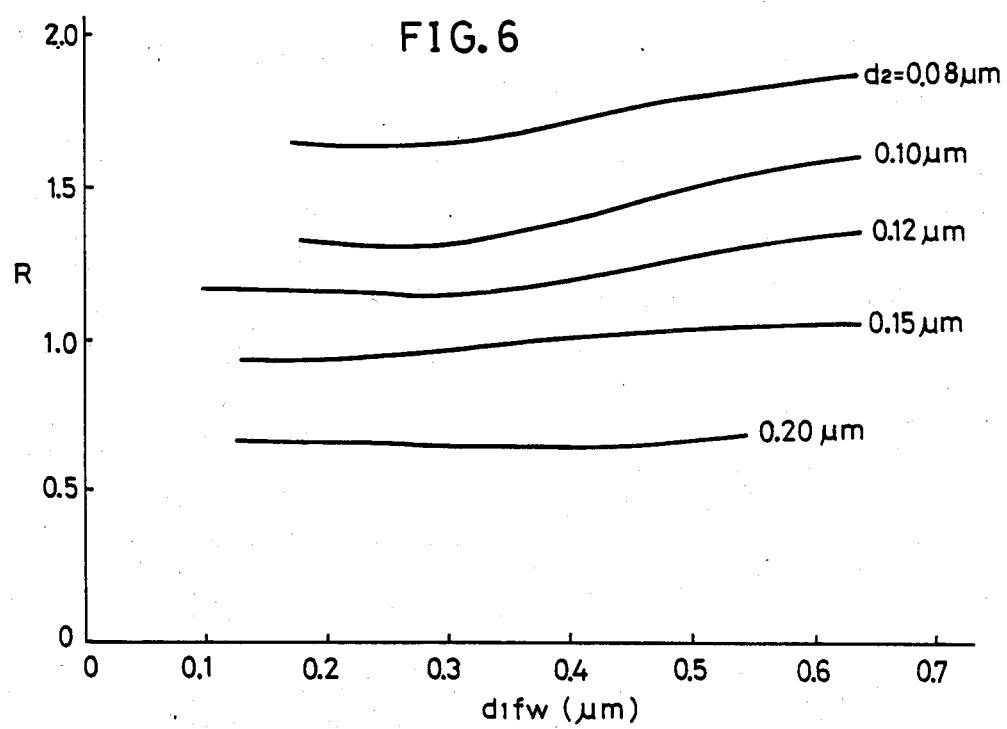
FIG. 6 is a graph showing the relationship between the thickness $d_{1fw}$ and the parameter R.

FIG. 5 shows the dependence of the parameter R on $d_2$ and FIG. 6 shows the dependence of the parameter R on $d_{1fw}$, each of which indicates that the parameter R depends greatly upon $d_2$ while dependence upon $d_{1fw}$ is minimal.

Figure 7:
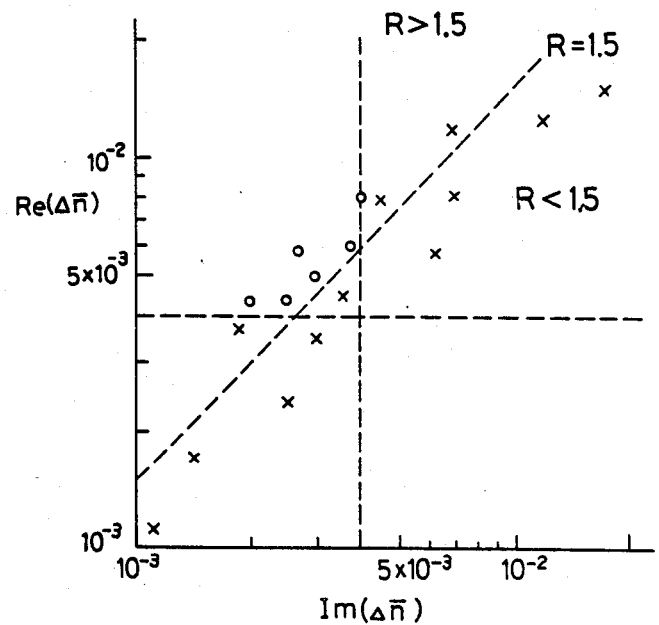
FIG. 7 is a graph showing the relationship between the imaginary number portion $Im(\Delta \bar{n})$ and the real number portion $Re(\Delta \bar{n})$ of the difference $\Delta \bar{n}$ in the complex refraction index and the parameter R.

Then, the inventors calculated the $Re(\Delta\bar{n})$ and $Im(\Delta\bar{n})$ of sample lasers which are different in thickness $d_2$ of the active layers therein. In some of these sample lasers, beam waists were positioned within 3 $\mu$m from their facets and in others, beam waists were positioned beyond 3 $\mu$m from their facets. The results are shown in FIG. 7, wherein the mark O indicates that the beam waist is within 3 $\mu$m from the facet and the mark X indicates that the beam waist is beyond 3 $\mu$m from the facet. It can be seen from FIG. 7 that $Re(\Delta\bar{n})$ must be $4 \times 10^{-3}$ or more, $Im(\Delta\bar{n})$ must be $4 \times 10^{-3}$ or less and R must be 1.5 or more in order that the beam waist is within 3 $\mu$m from the facet.

If the above-mentioned requirements are satisfied in a stabilized transverse mode up to a high output power and does not effect astigmatism, can be obtained.

Thus, the semiconductor of this invention's laser has an active layer with the thickness $d_2$, which is as thin as possible to such an extent that the threshold current level does not increase, and a p-cladding layer with the thickness $d_{1fw}$, which is preferably as thick as possible to such an extent that the above-mentioned requirements are satisfied.

Another feature of the semiconductor laser of this invention is that the transverse mode is determined by the distribution of the refraction index, the loss of current consisting of two steps, so that the peak shift of far-field patterns is not observed even at operation with a high power output. On the contrary, in the conventional VSIS laser the transverse mode is determined by the one step distribution of the refraction index/the loss of current.

The semiconductor laser of this invention is also excellent in the control of the thickness $d_{1fw}$ of the p-cladding layer, since the first channel 9 is formed by an etching technique resulting in the depth $D_2$ which is uniform over thw hole surface of the substrate 1 and also the p-cladding layer 3 is formed outside of the channel 9 by liquid phase epitaxy resulting in the depth $d_{1f}$ which is uniform to an extend to approximately 0.15 $\mu$m. Therefore, the thickness $d_{1fw}$ ($=D_1+d_{1f}$) of the p-cladding layer 3 within the channel 9 is substantially uniform. Any layers as thick as 0.3 $\mu$m cannot be uniformly formed by liquid phase epitaxy alone. The thickness of each of them is uneven, ranging from 0.2 to 0.45 $\mu$m.

Figure 9:
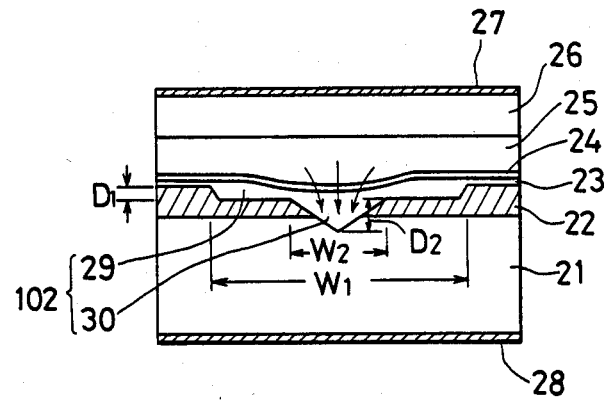
FIG. 9 is a front sectional view of a semiconductor laser with a crescent active layer of this invention.

FIG. 9 shows a semiconductor laser with a crescent active layer of this invention, which is the same structure as the one shown in FIG. 3 except that the active layer 24 is a concaved shape corresponding to the center portion of the two step-striped channel 102.

The active layer 24 is formed such that the curvature thereof becomes gentle, as the width $W_1$ of the channel 29 is wide and the depth $D_1$ of the channel 29 is shallow, so that the variation $\Delta d$ in the thickness of the active layer 24 becomes gentle resulting in laser oscillation in a fundamental transverse mode. Moreover, this semiconductor laser allows current to flow into the center portion of the two step-striped channel 102. Provided that current flows through the whole channel 102, variation of the carrier distribution within the active layer arises in accordance with the shape of the two stepstriped channel 102 (i.e., spacial hole burning arises). Thus, the gain distribution is in accord with the optical strength distribution of a first-order transverse mode and the first-order mode gain is greater than the zero-order mode gain, resulting in laser oscillation in a first-order transverse mode.

As mentioned above, the semiconductor laser with a crescent active layer shown in FIG. 9 is constructed such that the curvature of the crescent active layer can be made gentle depending upon the width $W_1$ and the depth $D_1$ of the channel 29 and current flows into the center portion of the channel 102, thereby maintaining laser oscillation in the fundamental transverse mode up to a high output power.

FIGS. 12(a) and (b) show a window BSIS (broad-channeled substrate inner stripe) semiconductor laser of this invention, which is produced as follows:

On the p-substrate 51, an n-current blocking layer 52 is formed to cut off current to the p-substrate 1. The current blocking layer 52 is etched by a well known etching technique to form a channel 59 having the width $W_{11}$ and the depth $D_1$ in the inside region of the facets and the width $W_{12}$ ($W_{11} > W_{12}$) and the depth $D_1$ in the window region of the facets. Then, by an etching technique, a V-shaped channel 60 having the width Wi ($W_{11} > W_{12} >$ Wi) is formed in the center portion of the channel 59, resulting in a two stepstriped channel 105 on the substrate 51. On the substrate 51, a double heterostructure laser-operating area is formed which successively comprises, for example, a p-cladding layer 53, a p-active layer 54, an n-cladding layer 55 and an n-cap layer 56. The active layer 54 is formed such that it is gently concave in the inside region corresponding to the channel 59 having the width $W_{11}$ and it is flat in the window region corresponding to the channel 59 having the width $W_{12}$, and that the curvature thereof becomes gentle as the width $W_{11}$ of the channel 59 is wide and the depth $D_1$ of the channel 59 is shallow, and accordingly, the variation in the thickness of the active layer 54 becomes small, resulting in laser oscillation in the fundamental transverse mode. Moreover, this window BSIS semiconductor laser allows current to flow into the center of the two step-striped channel 105. Provided that current flow over the whole channel 105, as mentioned in the semiconductor laser in FIG. 9, spacial hole burning arises resulting in laser oscillation in the first-order transverse mode.

The inventors found by an experiment that in the case where a VSIS laser with a crescent active layer and a VSIS laser with a plane active layer are separately manufactured under the same growth conditions, the former laser attains laser oscillation at a longer wavelength compared with the latter laser, that is, the bandgap of the crescent active layer is narrower than that of the plane active layer. Moreover, the curvature of the active layer makes the transverse mode less stable although the oscillation threshold current level becomes low, while the plane of the active layer makes the transverse mode stable, to a great extent, although the oscillation threshold current level becomes high. The above-mentioned experimental results suggest that if the optical waveguide in each of these two kinds of active layers is connected with each other in a line, laser oscillation arises in the concaved region and the plane region serves as only a window action which allows light to pass through. Thus, if the plane portion of the active layer is positioned in the vicinity of the facets, the level of the oscillation threshold current (Ith) in the resulting semiconductor laser will be reduced and a stabilized transverse mode will be attained. Moreover, a semiconductor laser having great output power, Pmax for the facet-breakdown, can be produced.

The window BSIS laser shown in FIGS. 12(a) and (b) was produced on the basis of the above-mentioned experimental knowledge. According to the structure of the inside region of the facets of the window BSIS laser shown in FIG. 12(a), a gentle curvature of the active layer 54 can be formed and current can be confined in the center portion of the two step-striped channel 105, thereby attaining laser oscillation in a fundamental transverse mode up to high output power. On the other hand, according to the structure in the window region of the window BSIS laser shown in FIG. 12(b), the thickness of the p-cladding layer 53 at both sides of the V-shaped channel 60 is greater than that of the conventional window laser shown in FIG. 3(b), thereby preventing astigmatism due to wavefront distortion in both sides of the V-shaped channel 60 and attaining an excellent differential quantum efficiency. The window BSIS laser of this invention, which is superior in both the inside region and the window region to the conventional window laser, attains laser oscillation in a stabilized fundamental transverse mode up to a high output power and is excellent in the differential quantum efficiency.

EXAMPLE 1

The BSIS laser shown in FIG. 3 was produced as follows:

On the face of a p-GaAs substrate 1, an n-GaAs current blocking layer 2 was grown with a thickness of 0.8 $\mu$m by liquid phase epitaxy, the surface of which was then etched by a photolithography method and a chemical etching technique to form a channel 9 having a width $W_1$ of 6.5 $\mu$m and a depth $D_1$ of 0.2 $\mu$m. The area from the center portion of the channel 9 to the upper portion of the p-GaAs substrate 1 was subjected to an etching treatment to form a V-shaped channel 10 having a width $W_2$ of 3.5 $\mu$m. On the resulting two step-striped channel 100, a double heterostructure was grown by liquid phase epitaxy, the double heterostructure successively comprising a p-$Ga_{0.5}Al_{0.5}As$ cladding layer 3 having a width $d_{1f}$ of 0.1 $\mu$m in the outside region of the channel 9 and a width $d_{1fw}$ of 0.3 $\mu$m in each of both side regions of the channel 9, a p-$Ga_{0.85}Al_{0.15}As$ active layer 4 having a width $d_2$ of 0.06 $\mu$m, an n-$Ga_{0.5}Al_{0.5}As$ cladding layer 5 and an n-GaAs cap layer 6. The parameter R, the effective refraction index difference $\Delta N$ and the loss difference $\Delta \alpha$ were calculated, each of which were 2, $8 \times 10^{-3}$ and 650 $cm^{-1}$, respectively.

Then, the surface of the n-GaAs cap layer 6 and the back of the p-GaAs substrate 1 were subjected to a vacuum evaporation treatment with metal materials of Au-Ge-Ni and Au-Zn, respectively, followed by heating at 450° C. to form an electrode 7 made of an alloy of Au-Ge-Ni and an electrode 8 made of an alloy of Au-Zn, respectively.

The resulting semiconductor laser was cleaved to obtain a laser unit having a length of 250 $\mu$m, which could attain laser oscillation in a stabilized fundamental transverse mode at a wavelength $\lambda$ of 780 nm at a threshold current of 45 mA up to an optical output power of 40 mW, while the peak shift of either of the near-field pattern and the far-field pattern was not observed. The beam waist coincided in position with the facet in the direction parallel and vertical to the junction up to an optical output power of 40 mW. The differential quantum efficiency was 25% at one side of the facet.

Figure 8:
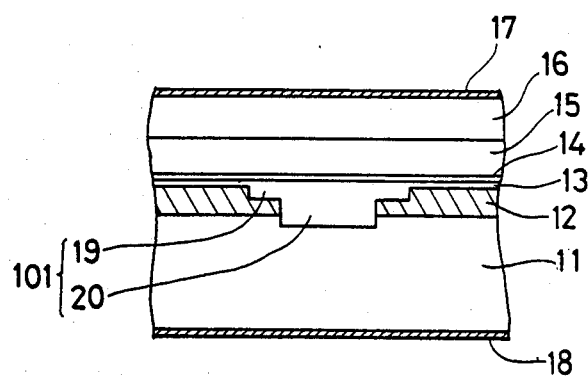
FIG. 8 is a front sectional view of another BSIS semiconductor laser of this invention.

Another BSIS laser of this invention exhibiting the same characteristics as the above-mentioned device shown in FIG. 3 is shown in FIG. 8, wherein the two step-striped channels 101 were formed by a reactive ion etching technique. The feature of this BSIS laser is that the channel 101 is stairshaped, while the channel 100 of the BSIS laser shown in FIG. 3 which was prepared by a chemical etching technique is tapered.

EXAMPLE 2

. FIG. 9 shows a semiconductor laser with a crescent active layer of this invention, which was produced as follows:

On the face of a p-GaAs substrate 21, an n-GaAs current blocking layer 22 was grown by molecular beam epitaxy, the surface of which was then etched by a photolithography method and a chemical etching technique to form a channel 29 having a width $W_1$ of 12 μm and a depth $D_1$ of 0.2 μm. The area from the center portion of the channel 29 to the upper portion of the p-GaAs substrate 21 was subjected to an etching treatment using a mask alignment means to form a V-shaped channel 30 having a width $W_2$ of 4 μm and a depth $D_2$ of 1 μm, resulting in a two step-striped channel 102 on the substrate 21. A laser-operation area having a double heterostructure was grown by liquid phase epitaxy on the substrate 21 provided with the channel 102. The double heterostructure successively comprises a p-$Ga_{0.5}Al_{0.5}As$ cladding layer 23, a p-$Ga_{0.85}Al_{0.15}As$ active layer 24, an n-$Ga_{0.5}Al_{0.5}As$ cladding layer 25 and an n-GaAs cap layer 26. The growth rate of each of the p-cladding layer 23 and the active layer 24 was controlled such that the upper face of the p-cladding layer 23 was concaved in accordance with the shape of the two step-striped channel 102 and the gently concaved active layer 24 was formed on the p-cladding layer 23. The thickness of the active layer 24 corresponding to the center portion of the channel 102 was 0.08 μm, while the thickness of the active layer 24 corresponding to each of both sides of the channel 102 was 0.07 μm. The difference ΔN of the effective refraction index based on the variation of the thickness of the active layer 24 is $2 \times 10^{-3}$. The upper face of the n-cladding layer 25 is flat.

Then, electrodes 27 and 28, which are made of alloys of Au-Ge-Ni and Au-Zn, respectively, were formed on the surface of the cap layer 26 and the back of the substrate 21, respectively, in the same manner as in Example 1, and were connected to a driving source to initiate laser oscillation. A current injected into the active layer 24 flows into the V-shaped channel 30, as an electroconductive region, which is not covered by the current blocking layer 22.

The resulting semiconductor laser attained laser oscillation in a stabilized fundamental transverse mode at a wavelength of 780 nm at a threshold current of 20 mA up to an optical output power of 25 mW. The differential quantum efficiency was 25% at one side of the facet.

Figure 10:
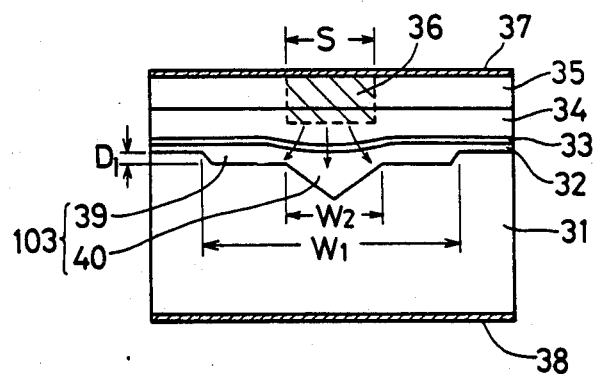
FIG. 10 is a front sectional view of another semiconductor laser with a crescent active layer of this invention.

Another semiconductor laser with a crescent active layer is shown in FIG. 10, which is different from the one shown in FIG. 9 in that a so-called planer-striped structure has been adopted thereto. This semiconductor laser comprises an n-GaAs substrate 31, an n-$Ga_{0.6}Al_{0.4}As$ cladding layer 32, an n-$Ga_{0.95}Al_{0.05}As$ active layer 33, a p-$Ga_{0.6}Al_{0.4}As$ cladding layer 34, an n-GaAs cap layer 35, a Zn-diffused region 36, and electrodes 37 and 38. The widthes $W_1$ and $W_2$ of the channels 39 and 40 constituting the two step-striped channel 103 are 12 μm and 4 μm, respectively, and the width S of the Zn-diffused region 36 is 4 μm. The semiconductor laser attained laser oscillation in a stabilized fundamental transverse mode at a wavelength of 820 nm at a threshold current of 25 mA up to an optical output power of 18 mW. The differential quantum efficiency was 20% at one side of the facet.

Figure 11:
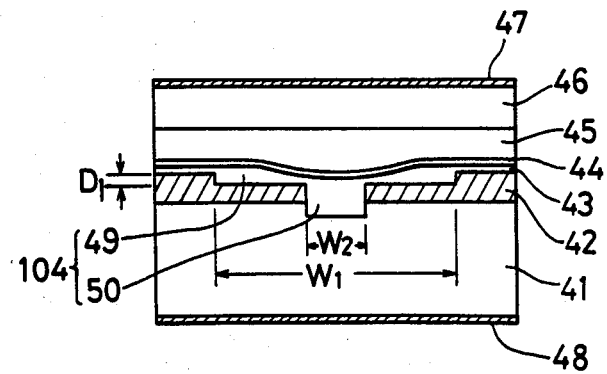
FIG. 11 is a front sectional view of another semiconductor laser with a crescent active layer of this invention.

Another semiconductor laser with a crescent active layer of this invention exhibiting the same characteristics as the one shown in FIG. 9 is shown in FIG. 11, wherein the two step-striped channel 104 was formed by a reactive ion etching technique. The main feature thereof is that the channel 104 is stair-shaped, while the channel 102 of the semiconductor laser shown in FIG. 9 which was prepared by a chemical etching techique is tapered.

All of the semiconductor lasers in Example 2, wherein the curvature of the active layer of each thereof is easily controlled, can maintain a fundamental transverse mode at a low threshold current level up to a high output power, resulting in a high differential quantum efficiency.

EXAMPLE 3

The window BSIS laser shown in FIGS. 12(a) and (b) was produced as follows:

On a Zn-doped p-GaAs substrate (p=$1 \times 10^{19}$ $cm^{-3}$)51, a Te-doped n-GaAs current layer (n=$3 \times 10^{18}$ $cm^{-3}$)52, was grown with a thickness of approximately 0.8 μm by liquid phase epitaxy, the surface of which was then etched by a photolithography method and a chemical etching technique to form a channel 59 having a width ranging from $W_1$ to $W_2$ ($W_1 > W_2$) as shown in FIGS. 12(a) and 13(a), wherein $L_1$=200 μm, $L_2$=50 μm, $W_1$=11 μm, $W_2$=6.5 μm and $D_1$=0.2 μm. Then, as shown in FIGS. 12(b) and 13(b), in the center portion of the channel 59, a V-shaped channel 60 was formed with a width Wi of 3.5 μm by a photolithography method and a chemical etching technique. The V-shaped channel 60 was formed to reach the p-GaAs substrate 51 directly. Due to the formation of the V-shaped channel 60, the corresponding portion of the n-GaAs current blocking layer 52 was removed from the p-GaAs substrate 51, resulting in an electric current path therein which is in a striped structure.

Then, on the substrate 51 having the channels 59 and 60 which constitute a two step-striped channel 105, a p-$Ga_{0.5}Al_{0.5}As$ cladding layer 53, a p-$Ga_{0.85}Al_{0.15}As$ active layer 54, an n-$Ga_{0.15}Al_{0.5}As$ cladding layer 55 and an n-GaAs cap layer 56 were successively grown, by liquid phase epitaxy, with a thicknesses of 0.15 μm, 0.04 μm, 1.0 μm and 2 μm, respectively, outside of the channel as shown in FIGS. 12(a) and (b). The thickness of the center portion of each of the concaved active layers shown in FIGS. 12(a) and (b) was 0.08 μm and 0.04 μm. The thickness of the p-cladding layer 53 within the channel 59 was 0.3 μm. The upper face of a n-cladding layer 55 in either of the inside or the vicinity of the facet was flat.

Then, electrodes 57 and 58, which are made of alloys of Au-Ge-Ni and Au-Zn, respectively, were formed on the surface of the n-GaAs cap layer 56 and the back of the p-GaAs substrate 51, respectively, in the same manner as in Example 1, resulting in a window BSIS laser. It is then cleaved at the center of the window region having a length $L_2$ of 50 μm to form a laser unit having a window region of the 25 μm length at each of both sides.

The window BSIS laser units attained laser oscillation in a stabilized fundamental transverse mode at a wavelength of 780 nm at a threshold current of 30 mA up to an optical output power of 30 mW or more. Some of the units could attain laser oscillation in a stabilized fundamental transverse mode up to 120 mW. The differential quantum efficiency was 25% at one side of the facet. In the case that a dielectric film was vacuum evaporated on the facet of the unit such that the reflection index is 95% at the backward facet and 2% at the forward facet from which light is taken out, these units operated in a stabilized fundamental mode up to 60 mW or more and the differential quantum efficiency was 55% at the forward facet. Moreover, output power for the facet breakdown was 200 mW in pulse operation and 150 mW in Cw (continuous wave) operation.

The window BSIS laser unit of the abovementioned structure having an oscillation wavelength of 780 nm was subjected to a continuous operation at an output power of 50 mW at 50° C. over 3000 hours, but deterioration was not observed. It was confirmed by an experiment that the unit is unharmed by accidents such as occurrences of surging current.

Figures 14A, 14B:
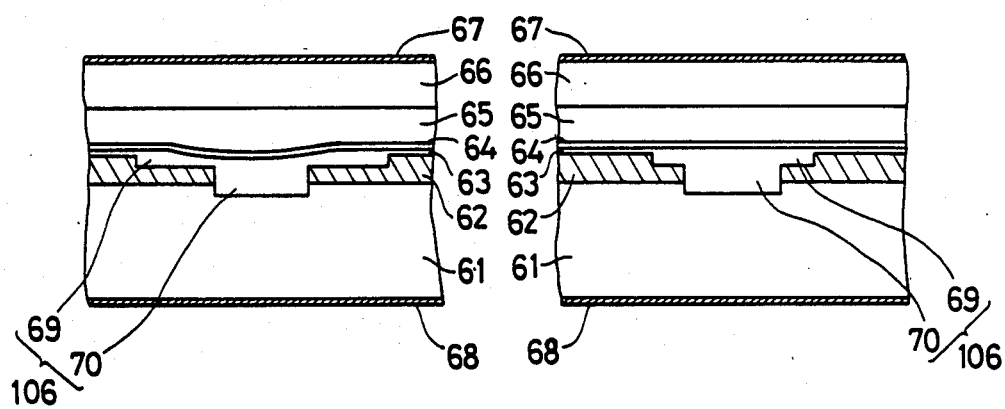
FIGS. 14(a) and (b) are front sectional views of the inside region and the window region of another window BSIS semiconductor laser of this invention, respectively.

Another window BSIS laser exhibiting the same characteristics as the above-mentioned device shown in FIGS. 12(a) and (b) is shown in FIGS. 14(a) and (b), wherein the two step-striped channel 106 was formed by a reactive ion etching technique. The main feature thereof is that the channel 106 is stair-shaped, while the channel 105 of the window BSIS laser shown in FIG. 12 which was prepared by a chemical etching technique is tapered.

All of the window lasers in Example 3, wherein the curvature of the active layer of each thereof is easily controlled, can attain laser oscillation in a stabilized fundamental transverse mode up to a high output power at a low threshold current level resulting in a high differential quantum efficiency. These window leasers are excellent in reliability at a high output power.

Any of these semiconductor lasers according to this invention are not limited to the GaAs-GaAlAs system, but they can be applied to an InP-InGaAsP system and/or other heterostructure laser devices. Any of the current blocking layers can be grown by metal-organic chemical vapor deposition (MO-CVD) and/or molecular beam epitaxy (MBE) instead of liquid phase epitaxy.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. In a semiconductor laser comprising:
a substrate having a two step-striping channel; and
a double heterostructure-laser-operating area having successively a first cladding layer, an active layer and a second cladding layer on said substrate, said two step-striped channel being composed of a first channel and a second channel having a width which is narrower than the width of said first channel and having a depth which is deeper than the depth of said first channel, and said second channel being positioned in the center portion of said first channel, thereby allowing current injected into said active layer to flow into the center portion of said two step-striped channel, the improvement wherein the difference $\Delta \bar{n}$ in complex refraction index between the inside and the outside of said second channel is at least $4 \times 10^{-3}$ with regard to the real number portion $Re(\Delta \bar{n})$ thereof, and no more than $4 \times 10^{-3}$ with regard to the imaginary number portion $Im(\Delta \bar{n})$ thereof, and the ratio of $Re(\Delta \bar{n})$ to $Im(\Delta \bar{n})$ is at least 1.5.

2. A semiconductor laser according to claim 1, wherein said active layer is a crescent active layer having a downward curvature corresponding to the center portion of said two step-striped channel.

3. A semiconductor laser according to claim 1, wherein the thickness of said active layer corresponding to the center portion of said two step-striped channel is greater than that of said active layer corresponding to each of both sides of said two step-striped channel.

4. A semiconductor laser according to claim 1, wherein said first channel has a selected width to form window regions in the vicinity of the facets of the laser, said active layer is a plane-shape in each of said window regions in the vicinity of the facets of the laser and a crescent-shape in the other region in the inside of the laser, resulting in a window stripe semiconductor laser.

5. In a semiconductor laser comprising:
a substrate;
a two step-striped channel formed on said substrate and including a first channel and a second channel formed in said first channel, said second channel being narrower and deeper than said first channel; and
a double heterostructure-laser-operating area formed over said substrate and including a first cladding layer disposed on a side of said area adjacent to said substrate, an active layer disposed on said first cladding layer, and a second cladding layer disposed on said active layer;
the improvement wherein:
said active layer and said first cladding layer have thicknesses selected so that the difference $\Delta \bar{n}$ in complex refraction index between the inside and the outside of said second channel has a real number portion $Re(\Delta \bar{n})$ of at least $4 \times 10^{-3}$ and an imaginary number portion $Im(\Delta \bar{n})$ of no more than $4 \times 10^{-3}$, and the ratio of $Re(\Delta \bar{n})$ to $Im(\Delta \bar{n})$ is at least 1.5.

6. A semiconductor laser according to claim 5, wherein said active layer has a concave portion which bulges downwardly in the central region of said two step-striped channel.

7. A semiconductor laser according to claim 5, wherein said first channel has a selected width to form window regions in the vicinity of the facets of said laser, said active layer has a planar shape in each of said window regions in the vicinity of the facets of the laser and a concave shape at the inside region of the laser resulting in a window stripe semiconductor laser.

8. A semiconductor laser according to claim 5, wherein:
said substrate comprises an n-GaAs substrate;
said first cladding layer comprise an n-GaAlAs cladding layer;
said active layer comprises an n-GaAlAs active layer; and
said second cladding layer comprises a p-GaAlAs cladding layer.

9. A semiconductor according to claim 8, and further including an n-GaAs cap layer disposed on said second cladding layer.

10. A semiconductor laser according to claim 5, and further comprising a current blocking layer disposed on said substrate between said substrate and said first cladding layer, said two step-striped channel being formed in said current blocking layer, with said second channel extending into a portion of said substrate.

11. A semiconductor laser according to claim 10, wherein:

said substrate comprises a p-GaAs substrate;

said current blocking layer comprises an n-GaAs current blocking layer;

said first cladding layer comprises a p-GaAlAs cladding layer;

said active layer comprises a p-GaAlAs active layer; and said second cladding layer comprises an n-GaAlAs cladding layer.

12. A semiconductor laser according to claim 11, and further including an n-GaAs cap layer disposed on said second cladding layer.

* * * * *